United States Patent [19]
[11] 3,950,272
Mardix et al.
[45] Apr. 13, 1976

[54] METHOD OF PREPARING CONDUCTRON-TYPE PHOTOCONDUCTORS AND THEIR USE AS TARGET MATERIALS FOR CAMERA TUBES

[76] Inventors: Shmuel Mardix, Faculty Apt. No. 3E, University of Rhode Island, Kingston, R.I. 02881; Paul M. McIlvaine, Deer Park, Apt. No. 30, Rte. 320, Rubey Road, West Willington, Conn. 06279; Sol Nudelman, 1401 Big Rock Road, Tucson, Ariz. 85718

[22] Filed: Jan. 30, 1974

[21] Appl. No.: 437,775

[52] U.S. Cl. .................................... 252/501; 96/1.5
[51] Int. Cl.[2] .......................................... H01L 13/00

[58] Field of Search ......... 96/1.5; 252/501; 317/234

[56] References Cited

UNITED STATES PATENTS

| | | | |
|---|---|---|---|
| 2,177,736 | 10/1939 | Miller | 96/1.5 |
| 3,025,160 | 3/1962 | Bunge | 252/501 |

*Primary Examiner*—David Klein
*Assistant Examiner*—John L. Goodrow
*Attorney, Agent, or Firm*—Thompson, Birch, Gauthier & Samuels

[57] ABSTRACT

The present invention relates to novel photoconductive materials, their preparation, and their use in camera tubes. In particular, we disclose a method for preparing a Conductron-type photoconductive element from silver sulfide.

11 Claims, No Drawings

METHOD OF PREPARING CONDUCTRON-TYPE PHOTOCONDUCTORS AND THEIR USE AS TARGET MATERIALS FOR CAMERA TUBES

BACKGROUND

Many compounds exhibit a photovoltaic or photoconductive effect on exposure to a light source. Such compounds are typically coated, deposited or otherwise placed in very thin layers on conductive surfaces, such as on solid semiconductive surfaces of metals like germanium, gelenium, silicon and the like or combinations thereof to form heterojunctions, or on solid transparent and conductive surfaces, such as of glass, plastic or the like which has previously been coated with a transparent conductive material. For example, in the latter case, photoconductive compounds have been usefully employed as target materials in an electron tube by binding the photoconductive target material in a thin coating to the glass tube surface and thereafter exposing the tube to a visible, infrared, or ultraviolet-containing light source. Such a procedure is described in U.S. Pat. No. 2,555,001 to H. G. Lubszynski. Conventional camera tubes prepared in this fashion have been of the "Vidicon" or storage-type and have operated with photoconductive materials having resistivities on the order of about $1 \times 10^{12}$ ohm-cm. Recently it has become apparent that in certain applications, particularly when working at low light levels, it would be highly desirable to operate a camera tube with a photoconductive material having a resistivity on the order of $1 \times 10^6$ ohm-cm. Using a material of about this order of resistivity, a photoconductive element could be prepared that would be, for practical purposes, fully conductive, or, at most, exhibit partial storage. Such "Conductron" - type devices are described in French Pat. No. 1,008,032 to W. Veith. A material having a lower order of resistivity than about $1 \times 10^6$ ohm-cm. could be employed to produce a conductive-type photoconductive element, but only at a great loss in the light sensitivity of the completed element. Up to now there has been no wholly successful effort at preparing a "Conductron"-type element.

OBJECTS

Accordingly, it is an object of the present invention to prepare a photoconductive material having a low resistivity on the order of $1 \times 10^6$ ohm-cm. as compared with conventional Vidicon-type materials.

It is a further object of the present invention to prepare a photoconductive element which is conductive or exhibits only partial storage in ordinary use.

Finally, it is an object of this invention to use the photoconductive materials of this invention in "Conductron"-type camera tubes.

SUMMARY

The objects of this invention are achieved by a three-step procedure. In the first step of our process, microcrystallites of silver sulfide in the $\beta$ (beta)-form are produced by low temperature crystallization from a reactive solution. These micro-crystallites then serve as nucleation centers for an overgrowth of the same or other sulfides in the second step of the process. In the final step, the composite sulfide from the second step is bound using epoxy resin as the binder to a transparent and conductive surface, such as glass or plastic which has previously been coated with a transparent conductive material thereby completing the photoconductive element or target.

DESCRIPTION OF PREFERRED EMBODIMENT

The photoconductive properties of silver sulfide ($Ag_2S$) have long been recognized. Silver sulfide exists in two isomeric forms. The $\alpha$ (alpha)-form appears to show only a low order of photoconductive response, or its photoconductive response is masked because of its low sensitivity due to a low resistivity of about $1 \times 10^{-2}$ ohm-cm. The photoconductive response of the $\beta$ (beta)-form is much better, but its resistivity of about $1 \times 10^4$ ohm-cm. is still a couple orders of magnitude too low for it to be useful as a target material in a camera tube. H. Miller and J. W. Strange, *Proc. Phys, Soc.*, vol. 50 at 374 (1938), in the only reported attempt in using silver sulfide in a camera tube, report that it failed to show even the slightest response. By contrast, the silver sulfide prepared in accordance with this invention and used in the manner hereinafter described produces a photoconductive element or target which is conductive and at the same time sufficiently light-sensitive to operate in Conductron-type camera tubes.

The first step of the process of our invention is the preparation of microcrystallites of silver sulfide consisting predominantly of the $\beta$ (beta)-form. This is achieved through a modification of a method described by J. L. Davis and M. K. Norr, *J. Appl. Phys.*, vol 37 at 1670 (1966), for the preparation of photoconductive plumbic sulfide (Pb S). In our preferred method, an organic sulfur source, such as thioacetamide, is reacted in an aqueous solution with silver nitrate salt in the presence of nitric acid. The degree of acidity may be varied but typically ranges from $1 \times 10^{-5}$ to 1.0 N. (normal). The reaction is carried out at a low temperature of below 15°C and, preferably, from about 0°–5°C. This procedure produces a high yield of photo-conductive $\beta$ (beta)-silver sulfide in the form of a microcrystalline suspension. It is believed that any hydrolyzable organic sulfur compound, such as thiourea, may be used in place of thioacetamide in this first step of the process.

The second step of our process consists of employing the microcrystallites of the first step as nucleation centers for an overgrowth of silver or another metallic sulfide to a particle size of about 1–10 microns, preferably about 5 microns. An overgrowth of silver sulfide is accomplished by adding to the suspension of microcrystallites a source of inorganic sulfide, for example, hydrogen sulfide or sodium sulfide. The use of such water-soluble inorganic sulfides leads to a further deposition of silver sulfide on the microcrystallites. Alternatively, the silver sulfide microcrystallites can be removed from the aqueous system, washed, and placed in a second mildly acidic solution together with a soluble salt of a metal other than silver and a weak source of sulfide ion and thereby cause an overgrowth of the sulfide of the other metal on the microcrystallites. Such a second solution might consist of nitric acid, zinc nitrate, and thioacetamide to obtain an overgrowth of zinc sulfide. The second step is preferably carried out at room temperatures of about 20°–25°C. The suspension is then filtered through a Millipore filter (average pore diameter of 0.45 microns).

In the final step of our process, the composite photoconductive sulfide particles obtained in the second step are bound to a transparent, photoconductive surface or substrate with a binder layer of epoxy resin to form a target. The surface or substrate is typically glass or plastic coated with a transparent and conductive material such as particles of tin oxide. The target is suitable for use in a Conductron-type camera tube.

Camera tubes prepared in accordance with our invention exhibit photoconductive response in the visible and near infrared radiation regions, with a cutoff of radiation response at about 1.6$\mu$ at room temperatures of about 25°C. That is, the camera tubes prepared in accordance with this invention exhibit an extended infrared photoconductive response in comparison with conventional Vidicon-type camera tubes wherein a cutoff occurs at about 1.1$\mu$. Such a technique provides a significant improvement in television tubes operating in the red response region together with the ability to obtain greater television line density and enhanced signals.

To further illustrate the preferred practice of our invention, we present the following examples thereof:

EXAMPLE 1

Two hundred and fifty milliliters (250 ml) of distilled water are cooled to about 2°C and then 60 ml of $10^{-4}$ N (normal) nitric acid ($HNO_3$) is added, followed by the addition of 20 ml of 0.1M (molar) thioacetamide as an organic sulfur source (3.75 grams thioacetamide in 495 ml distilled and deionized water), and the addition of 20 ml of 0.05M (molar) silver nitrate ($AgNO_3$) (4.25 grams silver nitrate in 499 ml of distilled and deionized water) as a water-soluble inorganic silver salt. The final pH of the solution mixture is about 1.0. The reaction solution is stirred for 20 to 30 seconds, and then placed in a refrigerator at about 2°C for 3.5 hours. The reaction solution provides a microcrystallite suspension of photoconductive silver sulfide particles in the solution which serve as nucleation centers for the overgrowth of additional silver sulfide.

One hundred milliliters (100 ml) of the reaction solution containing a proportionate part of the silver sulfide is then mixed with 25 ml sodium sulfide solution which provides a source of inorganic sulfur ions for the overgrowth of silver sulfide on the microcrystallites. The sodium sulfide solution is prepared from a 10% dilution of 0.1M (molar) $Na_2S{\cdot}9H_2O$ (12 grams $Na_2S{\cdot}9H_2O$ in 492 ml distilled and deionized water). This procedure is carried out at room temperature of 20°–25°C. The resulting reaction mixture is then filtered through a Millipore filter (average pore diameter 0.45 microns), and the resulting silver sulfide layers in the filter washed with distilled and deionized water (about 300 ml) and then dried under a vacuum.

EXAMPLE 2

The silver sulfide particles in the filter of Example 1 were then tested directly for photoresponse in a standard test chamber consisting of two silver electrodes painted on a glass microscope slide. One centimeter strips of the silver sulfide layer from the filter material were cut from the filtered material and placed on the electrodes. The slide and strips were held in place by two plastic clamps and 15 volts direct current were applied between the electrodes. The dark resistivity of the silver sulfide so tested was found to be around $2 \times 10^5$ ohm-cm. This is in contrast to dark resistivities ranging from $1 \times 10^2$ ohm-cm. to $1 \times 10^4$ ohm-cm. reported previously for layers of $\beta$ (beta)-silver sulfide thicker than 0.45 microns. In our photoresponse test, the spectral response to the silver sulfide layer was found to be relatively flat in the visible range, and up to 1.6$\mu$ in the near infrared region, then declining and having about 50% response at 1.6$\mu$.

EXAMPLE 3

A target material was prepared consisting of a tin oxide-coated glass substrate with a binder layer of an epoxy resin. The epoxy resin was coated onto the surface of the glass substrate, and permitted to set until streaks caused by the application had disappeared, usually 5 or 10 minutes in order to reduce the textured appearance of the target material. The silver sulfide which had been collected on the filter material is pressed into the epoxy resin layer, and upon lifting the filter material, the silver sulfide microcrystallites on the filter material adhered to the epoxy resin layer on the glass substrate. Tests in a demountable television camera tube at 20° to 25°C containing the glass substrate as a target material showed that the silver sulfide compound of Example 1 was responsive to visible and near infrared radiation. We have found further that the resolution of a silver sulfide target material so prepared was about 9 line pairs per mm.

The foregoing description and examples are intended only to be exemplary of the practice of our invention which is not limited thereto. For example, apart from the use of our novel photoconductive material as a target for camera tubes, it is believed that our material and preparation process will find utility in the manufacture of coated paper for photocopying and in other applications where a photoconductive substance is required.

We claim:

1. A photoconductive element comprising a solid, transparent and conductive surface, a layer of epoxy resin as a binder, and a coating of photoconductive silver sulfide said element being characterized both by a resistivity on the order of $1 \times 10^6$ ohm-cm. and having a photoresponse in the visible and near infrared regions, and wherein said photoconductive silver sulfide is prepared by a method comprising the following steps:

a. reacting an excess of silver cation in an aqueous acidic solution with an organic sulfur compound to provide a microcrystallite suspension predominantly comprising photoconductive beta - silver sulfide in the reaction solution, said reaction carried out at a temperature of from about 0–15°C;

b. reacting excess silver cation in the reaction solution with an inorganic source of sulfide ion to provide for the overgrowth of silver sulfide on the microcrystallites; and, c. recovering the photoconductive sulver sulfide produced thereby.

2. The photoconductive element of claim 1 wherein said solid, transparent and conductive surface is glass coated with tin oxide.

3. The photoconductive element of claim 1 wherein the temperature of the reaction solution in preparing said microcrystallite suspension of silver sulfide is from about 0° –5°C.

4. The photoconductive element of claim 1 wherein the silver cation in preparing said silver sulfide is provided by silver nitrate.

5. The photoconductive element of claim 1 wherein the organic sulfur compound in preparing said silver sulfide is thiourea or thioacetamide.

6. The photoconductive element of claim 1 wherein the reaction of the excess silver cation in the reaction solution with sulfide ion in preparing said silver sulfide is carried out at a temperature of about 20° – 25°C.

7. The photoconductive element of claim 1 wherein the inorganic source of sulfide ion in preparing said silver sulfide is an aqueous solution of sodium sulfide.

8. The photoconductive element of claim 1 wherein the step of recovering the silver sulfide from the reaction solution is carried out by filtering the reaction solution.

9. The photoconductive element of claim 1 wherein said photoconductive silver sulfide is prepared by a method comprising the following steps:

a. reacting silver nitrate with thioacetamide in an aqueous acidic solution of nitric acid, the silver nitrate providing a stoichiometric excess of silver ion to provide a microcrystallite suspension of photoconductive beta - silver sulfide in the reaction solution, said reaction carried out at a temperature of from about 0° – 5°C;

b. reacting the excess silver cation from the silver nitrate in the reaction solution with a solution containing sodium sulfide to provide for the overgrowth of silver sulfide on the silver sulfide microcrystallites; and c. recovering the photoconductive silver sulfide produced thereby.

10. A photoconductive element comprising a solid, transparent and conductive surface, a layer of epoxy resin as a binder, and a coating of a photoconductive composite sulfide said element being characterized both by a resistivity on the order of $1 \times 10^6$ ohm-cm. and having a photoresponse in the visible and near infrared regions, and wherein said composite sulfide is prepared by a method comprising the following steps:

a. reacting an excess of silver cation in an aqueous acidic solution with an organic sulfur compound to provide a microcrystallite suspension predominantly comprising photoconductive beta - silver sulfide in the reaction solution, said reaction carried out at a temperature of from aboutu 0°–15°C;

b. removing and washing said microcrystallites and introducing them into a second aqueous acidic reaction solution containing a water-soluble salt of a metal other than silver and a weak source of sulfide ion to promote the overgrowth of the sulfide of said other metal on said microcrystallites; and, c. recovering the photoconductive composite sulfide particles produced thereby.

11. The photoconductive element of claim 10 wherein said other metal sulfide in the preparation of said composite sulfide is zinc sulfide.

* * * * *